United States Patent [19]
Sugino et al.

[11] 4,456,999
[45] Jun. 26, 1984

[54] TERRACE-SHAPED SUBSTRATE SEMICONDUCTOR LASER

[75] Inventors: Takashi Sugino, Takatsuki; Kunio Itoh, Uji; Masaru Wada, Takatsuki; Hirokazu Shimizu, Toyonaka, all of Japan

[73] Assignee: Matsushita Electric Industrial Co., Ltd., Kadoma, Japan

[21] Appl. No.: 270,352

[22] Filed: Jun. 4, 1981

[30] Foreign Application Priority Data

Jun. 13, 1980 [JP] Japan .................................. 55-80586

[51] Int. Cl.³ ............................................. H01S 3/19
[52] U.S. Cl. ...................................... 372/45; 372/46; 357/17
[58] Field of Search ...................... 372/45, 46; 357/17

[56] References Cited
U.S. PATENT DOCUMENTS

4,105,955 8/1978 Hayashi et al. ....................... 372/45

FOREIGN PATENT DOCUMENTS

54-107284 8/1979 Japan ..................................... 372/46

Primary Examiner—James W. Davie
Attorney, Agent, or Firm—Cushman, Darby & Cushman

[57] ABSTRACT

A terrace-substrate laser is improved by forming a stripe-shaped impurity diffused current-injection region (27) from the cap layer (25) at least so as to reach the oblique lasing region (231) of the active layer (23), so that the corner part of the current injection region (27) touches the lasing region (231); thereby current injection efficiency to the lasing region is highly improved and the injected current is effectively limited in the oblique lasing region even when a large current is injected, and furthermore, a threshold current can be greatly reduced. This laser can perform a stable fundamental transverse mode oscillation even at a large current operation.

3 Claims, 7 Drawing Figures

(PRIOR ART III)

TERRACE-SHAPED SUBSTRATE SEMICONDUCTOR LASER

BACKGROUND OF THE INVENTION

1. Field of the Invention

The present invention relates to an improvement in a semiconductor laser of terraced substrate type.

2. Description of the Prior Art

Semiconductor laser has advantages of smallness of bulk, high efficiency and direct modulation by means of its current, and therefore has a bright future as light sources for optical communication, optical data processing. Laser for such use necessitates characteristics of stable fundamental transverse mode lasing, low threshold current, high output of light and high reliability.

The conventional laser which has a structure of simple gain guiding has a difficulty in maintaining a transverse mode for a wide range of current, and therefore is liable to occurrence of undesirable mode conversion or a generation of higher modes. As a result of these, the light-current characteristic is likely to have a kink of characteristic curve or the device is likely to have a multiple longitudinal mode oscillation.

FIG. 1, FIG. 2 and FIG. 3 show various types of conventional semiconductor stripe laser, wherein FIG. 1 shows a planar stripe laser. The laser of FIG. 1 has a doublehetero structure which has on

- a substrate 1 of: n-GaAs
- a first clad layer 2 of: n-GaAlAs,
- an active layer 3 of: non-doped GaAlAs,
- a second clad layer 4 of: p-GaAlAs and
- an isolation layer 5 of: n-GaAlAs, which forms a p-n isolation junction between it and the underlying p-type second clad layer 4 and has therein a
- stripe shaped current injection region 6 of: p-type diffused region formed by diffusing an acceptor such as Zn, in a manner to penetrate it and diffuse into the midway of the second clad layer 4.

Numeral 7 and 8 designate p-side and n-side electrode ohmically contacting the current injection region 6 and the substrate 1, respectively.

In such planar stripe laser, the active layer has a flat structure and has uniform refractive index on all parts thereof. Therefore, the light confinement in the stripe shaped region of width W is not sufficient. Besides, current injected from the current injection region 6 is likely to spread as shown by the curve I of FIG. 1 and spread parts around both sides of the curve does not contribute to the oscillation. On the other hand, if the injected current is increased, the distribution of oscillated light becomes as of curve II which has undesirable peaks 9, 9 on side parts, resulting in loss of single fundamental transverse mode of oscillation.

FIG. 2 shows structure of another conventional laser, wherein the substrate 1 has a groove 10 of a stripe shaped pattern and on such substrate 1 a first clad layer 2 and an active layer 3 and known subsequent layers 4 and 5 are formed. In this laser, the stability of single mode oscillation is improved than the laser of FIG. 1; but the structure of the active layer per se is still flat like the structure of FIG. 1, that is, there is no means to limit spreading of the injected current. Accordingly, its threshold current is not sufficiently reduced.

FIG. 3 shows still another example of the conventional laser, which has been proposed by some members of the inventors of the present invention. One example of this laser has

- a terrace-shaped substrate 11 of: n-GaAs, and thereon epitaxial layers of
- a first clad layer 12 of: n-Ga$_{1-x}$Al$_x$As,
- an active layer 13 having an oblique lasing region 131 of: (non-doped) Ga$_{1-y}$Al$_y$As,
- a second clad layer 14 of: p-Ga$_{1-x}$Al$_x$As and
- a cap layer 15 of: p-GaAs, where $0 \leq y < x \leq 1$.

Thereon are formed insulation layer 16 of, for example, an SiO$_2$ having a stripe shaped opening W at the position above the oblique active region 131 formed over a step T of the substrate 1. And electrodes 18 and 17 are formed on the p-side and n-side of the substrate. In this prior art, the active layer has an oblique lasing region 131 defined by an upper bending part and a lower bending part which confines light therebetween, and the first clad layer 12 has a triangular thick part 121 under the oblique lasing region 131 and upper thinner part and a lower thinner part under an upper horizontal part and a lower horizontal part of the active layer 13, respectively. Therefore the thicker part 121 of the first clad layer 12 serves to prevent absorption of light into the substrate 11, while the thinner parts of the first clad layer 12 serves to allow absorption of light therethrough into the substrate 11. Therefore, by the difference of the light absorption from the active layer 13 to the substrate 11, the light is effectively confined in the lasing region 131 which is on the thicker part 121 and between the two bending parts, and thereby a single transverse mode oscillation is easily obtainable, the manufacture thereof is easy and life time thereof is long because of reasonable crystal structure. However, the terraced substrate laser structure of FIG. 3 still has a problem that some part of the injected current still flows into the upper and lower horizontal parts of the active layer 13 resulting in ineffective currents there and confinement of the injected current in the oblique lasing region is difficult, and therefore the external differential quantum efficiency is not sufficiently high. Besides, in order to prevent undesirable parasitic oscillation in the active layer 13 at the other parts than the oblique lasing region 131, the first clad layer 12 should be extremely thin at the parts under the above-mentioned "other parts", but such forming of the extremely thin clad layer is not easy.

SUMMARY OF THE INVENTION

The present invention purposes to provide an improved laser capable of stable fundamental mode lasing at a low threshold current. The laser of the present invention can also provide a stable fundamental single mode lasing even at an operation with a larger injection current for obtaining a strong output light.

BRIEF EXPLANATION OF DRAWINGS

FIG. 4(a), FIG. 4(b), FIG. 4(c) and FIG. 4(d) are sectional elevation views showing steps of manufacturing a semiconductor laser embodying the present invention, wherein FIG. 4(d) shows the finished laser.

DESCRIPTION OF THE PREFERRED EMBODIMENTS

The semiconductor laser in accordance with the present invention comprises:
- a terrace-shaped semiconductor substrate having a thinner part and a thicker part with a step inbetween,
- semiconductor epitaxial layers to form a doublehetero structure including an active layer which are formed on the terrace-shaped semiconductor substrate, thereby the active layer comprising an oblique lasing region at the part over a part which is near the step,
- a surface layer overriding the uppermost layer of the above-mentioned semiconductor epitaxial layers and having an opposite conductivity to that of the uppermost layer,
- a stripe-shaped impurity diffused region having an impurity opposite to that of the surface layer, the impurity diffused region having a pattern which is substantially parallel to and above the oblique lasing region and a corner of diffusion front near to the step reaches at least the oblique lasing region.

Figure 1:
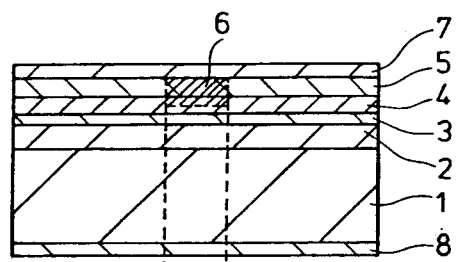
FIG. 1 is a sectional elevation view of the example of conventional planar type semiconductor laser.
Figure 2:
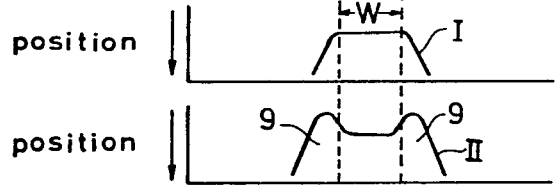
FIG. 2 is a sectional elevation view of the example of another type of conventional semiconductor laser.
Figure 2:
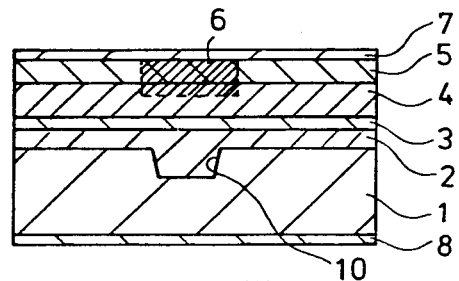
Figure 3:
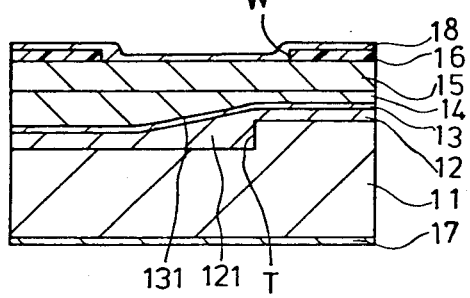
FIG. 3 is a sectional elevation view of the example of conventional terraced substrate type laser.

The present invention is an improvement of the laser of FIG. 3, wherein the active layer 13 has a thicker and oblique part 131 disposed between an upper and lower bending parts, in order to attain a fundamental transverse mode lasing at the oblique thicker part 131. The improved laser shown in the embodiment of FIG. 4(d) has a diffused current-injection region on top of the configuration of FIG. 3. That is, the embodiment of FIG. 4(d) has

- a terrace-shaped substrate 21 of: n-GaAs, and thereon epitaxial layers of
- a first clad layer 22 of: n-Ga$_{1-x}$Al$_x$As,
- an active layer 23 having an oblique lasing region 231 of: (non-doped)Ga$_{1-y}$Al$_y$As,
- a second clad layer 24 of: p-Ga$_{1-z}$Al$_z$As,
- a cap layer 25 of: n-GaAs, and
- a current injection region 27 of: Zn-diffused region, where $0 \leq y < x, z \leq 1$.

Thereon, a p-side electrode 28 and an n-side electrode 29 are formed on the p-side face and n-side face of the above-mentioned wafer.

The diffused region 27 is disposed in a stripe-shaped pattern at such position and to such depth that its one corner part penetrates the oblique lasing region 231 of the active layer 23, and its other corner lies on the lower part of the terrace-shaped substrate 21. The carrier concentration of the n-type first clad layer 22 is selected sufficiently large in order that at the diffusion of Zn therein the diffused part therein does not change its conductivity type. On the contrary, the carrier concentration of the p-type second clad layer 24 is selected low thereby to raise specific resistance thereof in order to restrict lateral spreading of the injected current from the current injection region 27. In this configuration, the injected current is taken in flowing through the diffused region 27 and injected in the oblique lasing part 231 of the active layer 23, and makes oscillation therein. Since the oblique lasing part 231 has a larger thickness than the horizontal parts of the active layer 23, the oscillation of transverse mode is stably confined in the oblique lasing part 231.

Figure 4:
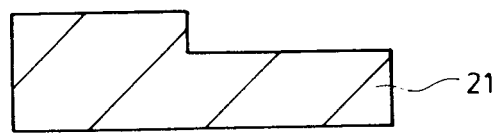
Figure 4:
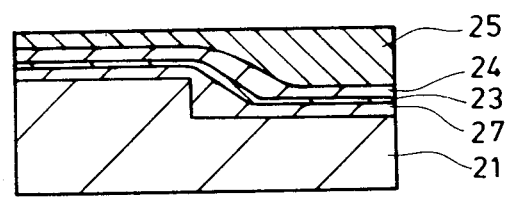
Figure 4:
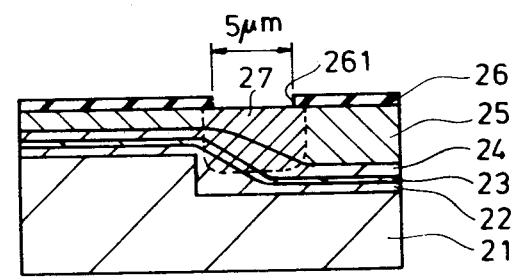
Figure 4:
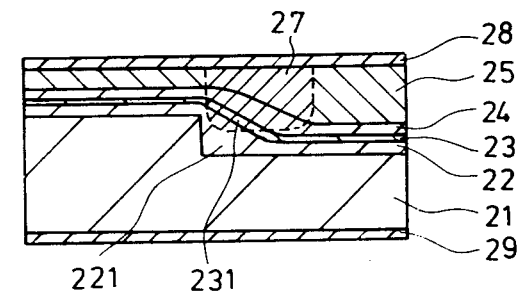

Hereinafter, manufacturing of the laser of FIG. 4(d) is elucidated in detail referring to FIG. 4(a) to FIG. 4(d).

A step of about 1.5 μm height is formed by chemical etching in the direction of <011> on a (100) surface of an n-GaAs substrate 21 as shown in FIG. 4(a), thus forming a terraced substrate. On the terraced substrate face the following layers are sequentially formed by means of known sequential liquid phase epitaxial growth method:

- a first clad layer 22, having triangular section part 221 at the step part, of: Ga$_{0.65}$Al$_{0.35}$As of about 0.2 μm thick at horizontal parts and about 1 μm thick at step part,
- an active layer 23, having oblique lasing part 231 on the triangular section part 221, of: n-Ga$_{0.95}$Al$_{0.05}$As of about $1 \times 10^{17}$ cm$^{-3}$ concentration and about 0.08 μm thick at horizontal parts and about 0.1 μm thick at oblique lasing part 231.
- a second clad layer 24, having oblique part on the oblique lasing part 231, of: p-Ga$_{0.65}$Al$_{0.35}$As of about $1 \times 10^{17}$ cm$^{-3}$ concentration and about 0.5 μm thick at horizontal parts and about 1 μm thick at the oblique part, and
- a cap layer 25, having substantially horizontal and flat upper face, of: n-GaAs of about $5 \times 10^{17}$ cm$^{-3}$ concentration and about 1 μm at over the thicker part of the substrate 1.

Then, an Si$_3$N$_4$ film 26 is formed to cover the wafer as a mask, and a stripe-shaped opening 261 of about 5 μm width is formed at the part over and near the foot part of the step of the substrate 1. That is the opening 261 is formed over a stripe shape part which is on the thinner part of the substrate 1 and near the step. Thereafter, a known Zn-diffusion as a p-type impurity is carried out through the opening 261, in a manner that the diffused front reaches at least the oblique lasing region 231, preferably to penetrate the oblique lasing region 231. Diffusion temperature is about 750° C. The opening 261 should be formed in a manner that a corner of the diffusion front which is on the side of the step of the substrate reaches or penetrates the active layer 23 at the oblique lasing part 231. Then, the Si$_3$N$_4$ mask 26 is removed by known method. A p-side electrode film 28 is formed by known vapor deposition method, and an n-side electrode film 29 is formed by known vapor deposition method followed by alloying with the substrate 1. The finished semiconductor laser wafer is then cleaved into individual unit chip and mounted onto a known copper mount (not shown).

In the above-mentioned semiconductor laser, the current is injected from the p-side electrode 28, through the impurity-diffused region 27, directly to the limited region in the lasing region 231 of the active layer 23, and therefore, the spreading of the injected current in the active layer is drastically limited in comparison with the prior art device of FIG. 3. Therefore, even in an operation of injecting a large current into the active layer, the lasing region is limited to a designed region, different from the conventional device where the lasing region becomes spreaded. Thereby the present semiconductor laser can oscillate with a stable fundamental transverse mode even at a large power oscillation. Furthermore, the threshold current is halved from the conventional device to about 40 mA, and external differential quantum efficiency drastically increases to a value of about 35%.

What is claimed is:

1. In a semiconductor laser including a terrace-shaped semiconductor substrate having a thin part of a thicker part with a step inbetween, the improvement comprising:
semiconductor epitaxial layers to form a double-hetero structure including an active layer which are formed on said terrace-shaped semiconductor substrate, therby said active layer comprising an oblique lasing region at the part over a part which is near said step,
a thickness of said oblique lasing region being larger than that of a horizontal region of said active layer,
a surface overriding the uppermost layer of said semiconductor epitaxial layers and having an opposite conductivity to that of the uppermost layer, and
a stripe-shaped impurity diffused region having an impurity opposite to that of said surface layer, said impurity diffused region having a pattern which is substantially parallel to and above said oblique lasing region and a corner of a diffusion front near to said step reaches at least said oblique lasing region.

2. In a semiconductor laser including a terrace-shaped semiconductor substrate of a first conductivity type and having a thin part and a thicker part with a step inbetween, the improvement comprising:
semiconductor epitaxial layers including a first layer, a second layer and a third layer, said first, second and third layers having bendings over and near said step,
wherein said second layer comprises a lasing region between said bendings,
a thickness of said lasing region being larger than that of a horizontal region of said second layer,
a fourth layer formed on said third layer, and having opposite conductivity to said third layer, and
an impurity diffused region of stripe shape pattern disposed above said lasing region and ranging from said fourth layer to at least said second layer.

3. A semiconductor laser in accordance with claim 2, wherein
said substrate is an n-GaAs,
said first layer is an n-$Ga_{1-x}Al_xAs$,
said second layer is an n-$Ga_{1-y}Al_yAs$,
said third layer is a p-$Ga_{1-z}Al_zAs$,
said fourth layer is an n-GaAs,
said impurity in said impurity diffused region is Zn and $0 \leq y < x$, $z \leq 1$.

* * * * *